United States Patent
Hayashi

(10) Patent No.: US 8,269,542 B2
(45) Date of Patent: Sep. 18, 2012

(54) DIFFERENTIAL LATCH, DIFFERENTIAL FLIP-FLOP, LSI, DIFFERENTIAL LATCH CONFIGURATION METHOD, AND DIFFERENTIAL FLIP-FLOP CONFIGURATION METHOD

(75) Inventor: Tomohiro Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/029,649

(22) Filed: Feb. 17, 2011

(65) Prior Publication Data

US 2011/0133805 A1 Jun. 9, 2011

Related U.S. Application Data

(62) Division of application No. 12/047,419, filed on Mar. 13, 2008, now Pat. No. 7,915,940.

(30) Foreign Application Priority Data

Mar. 15, 2007 (JP) ................................. 2007-066144

(51) Int. Cl.
*H03K 3/00* (2006.01)

(52) U.S. Cl. ........................................................ 327/218

(58) Field of Classification Search .................. 327/212, 327/218

See application file for complete search history.

(56) References Cited

FOREIGN PATENT DOCUMENTS

JP 2005-318609 A 11/2005

*Primary Examiner* — Lincoln Donovan
*Assistant Examiner* — Daniel Rojas
(74) *Attorney, Agent, or Firm* — Sughrue Mion, PLLC

(57) ABSTRACT

A differential latch comprising a data holding transistor, the differential latch comprising: a resetting transistor that is connected to a gate electrode of the data holding transistor and is controlled by a reset signal; and a switching transistor that is connected to the gate electrode of the data holding transistor and is controlled by a switch signal, being an inverted version of the reset signal.

8 Claims, 7 Drawing Sheets

DIFFERENTIAL LATCH, DIFFERENTIAL FLIP-FLOP, LSI, DIFFERENTIAL LATCH CONFIGURATION METHOD, AND DIFFERENTIAL FLIP-FLOP CONFIGURATION METHOD

CROSS REFERENCE TO RELATED APPLICATIONS

This application is a divisional of U.S. patent application Ser. No. 12/047,419 filed Mar. 13, 2008, which claims priority from Japanese patent application No. 2007-066144 filed Mar. 15, 2007, the contents of all of which are incorporated herein by reference in their entirety.

RELATED ART

The present invention relates to a differential latch, a differential flip-flop, an LSI, a differential latch configuration method, and a differential flip-flop configuration method, and more particularly to a differential latch, a differential flip-flop, an LSI, a differential latch configuration method, and a differential flip-flop configuration method, each of which has a resetting function.

One example of the conventional differential flip-flop is described in Patent document 1. This conventional differential flip-flop is configured with a CML (Current Mode Logic). Further, in this differential flip-flop, the resetting transistor (M21 of FIG. 8 of Patent document 1) is connected between the data holding transistor (M1 and M5 of the same FIG. 8) and the transistor (M6 of the same FIG. 8) being controlled by a clock signal.

In such a manner, in a case of adding a circuit (resetting transistor) for realizing a function such as the resetting to the differential flip-flop, the related art increases the number of the vertical stacks of the transistor, thereby allowing its function to be realized.

[Patent document 1] JP-P2005-318609A

In the conventional CML differential flip-flop described in Patent document 1 as mentioned above, adding a circuit for realizing the function such as the resetting leads to an increase in the number of the vertical stacks of the transistor, whereby a total value of the voltage that is applied between a source electrode and a drain electrode is increased, and the voltage level of a logic "0" of the output signal is raised. Thus, the related art causes a problem that the operation becomes unstable.

SUMMARY OF THE INVENTION

An exemplary object of the present invention is to provide a latch, a flip-flop, an LSI, a latch configuration method, and a flip-flop configuration method that can solve the conventional problems described above.

The invention for solving the above-mentioned problems is characterized in that a differential latch comprising a data holding transistor, said differential latch comprising: a resetting transistor that is connected to a gate electrode of said data holding transistor and is controlled by a reset signal; and a switching transistor that is connected to the gate electrode of said data holding transistor and is controlled by a switch signal, being an inverted version of the reset signal.

The invention for solving the above-mentioned problems is characterized in that an LSI, comprising: one or more of said differential latches according to the above invention; a combination circuit; a reset signal distribution circuit; and a switch signal distribution circuit.

The invention for solving the above-mentioned problems is characterized in that an LSI, comprising: one or more of said differential latches according to the above invention; a combination circuit; a reset signal distribution circuit; and a switch signal distribution circuit.

The invention for solving the above-mentioned problems is characterized in that an LSI, comprising: one or more of said differential flip-flops according to the above invention; a combination circuit; a reset signal distribution circuit; and a switch signal distribution circuit.

The invention for solving the above-mentioned problems is characterized in that an LSI, comprising: one or more of said differential latches according to the above invention; a combination circuit; a reset signal distribution circuit; a switch signal distribution circuit; and a set signal distribution circuit.

The invention for solving the above-mentioned problems is characterized in that an LSI, comprising: one or more of said differential flip-flops according to the above invention; a combination circuit; a reset signal distribution circuit; a switch signal distribution circuit; and a set signal distribution circuit.

The invention for solving the above-mentioned problems is characterized in that a differential latch comprising a first data holding transistor and a second data holding transistor, said differential latch comprising: a first resetting transistor that is connected to a gate electrode of said first data holding transistor and is controlled by a reset signal; a first switching transistor that is connected to the gate electrode of said first data holding transistor and is controlled by a switch signal, being an inverted version of said reset signal; a second resetting transistor that is connected to the gate electrode of said second data holding transistor is controlled by the reset signal; and a second switching transistor that is connected to the gate electrode of said second data holding transistor and is controlled by said switch signal.

The invention for solving the above-mentioned problems is characterized in that an LSI, comprising: one or more of said differential latches according to the above invention; a combination circuit; a reset signal distribution circuit; and a switch signal distribution circuit.

The invention for solving the above-mentioned problems is characterized in that an LSI, comprising: one or more of said differential latches according to the above invention; a combination circuit; a reset signal distribution circuit; and a switch signal distribution circuit.

The invention for solving the above-mentioned problems is characterized in that an LSI, comprising: one or more of said differential flip-flops according to the above invention; a combination circuit; a reset signal distribution circuit; and a switch signal distribution circuit.

The invention for solving the above-mentioned problems is characterized in that an LSI, comprising: one or more of said differential latches according to the above invention; a combination circuit; a reset signal distribution circuit; a switch signal distribution circuit; a set signal distribution circuit; and an inverted set signal distribution circuit.

The invention for solving the above-mentioned problems is characterized in that an LSI, comprising: one or more of said differential flip-flops according to the above invention; a combination circuit; a reset signal distribution circuit; a switch signal distribution circuit; a set signal distribution circuit; and an inverted set signal distribution circuit.

The invention for solving the above-mentioned problems is characterized in that a differential latch comprising a first inputting transistor, a second inputting transistor, a first data holding transistor, and a second data holding transistor, said differential latch comprising: a first switching transistor that is connected to a gate electrode of said first data holding transistor and said second inputting transistor, and is controlled by a switch signal, being an inverted version of a reset signal; a first resetting transistor that is connected to the gate electrode of said first data holding transistor and a ground, and is controlled by said reset signal; a second switching transistor that is connected to the gate electrode of said second data holding transistor and said first inputting transistor, and is controlled by said switch signal; and a second resetting transistor that is connected to the gate electrode of said second data holding transistor and a power source, and is controlled by an inverted reset signal, being an inverted version of said reset signal.

The invention for solving the above-mentioned problems is characterized in that an LSI, comprising: one or more of said differential latches according to the above invention; a combination circuit; a reset signal distribution circuit; and a switch signal distribution circuit.

The invention for solving the above-mentioned problems is characterized in that an LSI, comprising: one or more of said differential latches according to the above invention; a combination circuit; a reset signal distribution circuit; and a switch signal distribution circuit.

The invention for solving the above-mentioned problems is characterized in that an LSI, comprising: one or more of said differential flip-flops according to the above invention; a combination circuit; a reset signal distribution circuit; and a switch signal distribution circuit.

The invention for solving the above-mentioned problems is characterized in that an LSI, comprising: one or more of said differential latches according to the above invention; a combination circuit; a reset signal distribution circuit; a switch signal distribution circuit; a set signal distribution circuit; and an inverted set signal distribution circuit.

The invention for solving the above-mentioned problems is characterized in that an LSI, comprising: one or more of said differential flip-flops according to the above invention; a combination circuit; a reset signal distribution circuit; a switch signal distribution circuit; a set signal distribution circuit; and an inverted set signal distribution circuit.

The invention for solving the above-mentioned problems is characterized in that a differential latch configuration method in a differential latch comprising a data holding transistor, wherein a resetting transistor that is connected to a gate electrode of said data holding transistor and is controlled by a reset signal, and a switching transistor that is connected to the gate electrode of said data holding transistor and is controlled by a switch signal, being an inverted version of the reset signal, are connected.

The invention for solving the above-mentioned problems is characterized in that a differential latch configuration method in a differential latch comprising a first data holding transistor and a second data holding transistor: wherein a first resetting transistor that is connected to a gate electrode of said first data holding transistor and is controlled by a reset signal, and a first switching transistor that is connected to the gate electrode of said first data holding transistor and is controlled by a switch signal, being an inverted version of said reset signal are connected; and wherein a second resetting transistor that is connected to the gate electrode of said second data holding transistor and is controlled by the reset signal, and a second switching transistor that is connected to the gate electrode of said second data holding transistor and is controlled by said switch signal are connected.

The invention for solving the above-mentioned problems is characterized in that a differential latch configuration method in a differential latch comprising a first inputting transistor, a second inputting transistor, a first data holding transistor, and a second data holding transistor: wherein a first switching transistor that is connected to a gate electrode of said first data holding transistor and said second inputting transistor, and is controlled by a switch signal, being an inverted version of a reset signal, and a first resetting transistor that is connected to the gate electrode of said first data holding transistor and a ground, and is controlled by said reset signal are connected; and wherein a second switching transistor that is connected to the gate electrode of said second data holding transistor and said first inputting transistor, and is controlled by said switch signal, and a second resetting transistor that is connected to the gate electrode of said second data holding transistor and a power resource, and is controlled by an inverted reset signal, being an inverted version of said reset signal, are connected.

BRIEF DESCRIPTION OF THE DRAWINGS

This and other objects, features and advantages of the present invention will become more apparent upon a reading of the following detailed description and drawings, in which.

EXEMPLARY EMBODIMENTS

Figure 1:
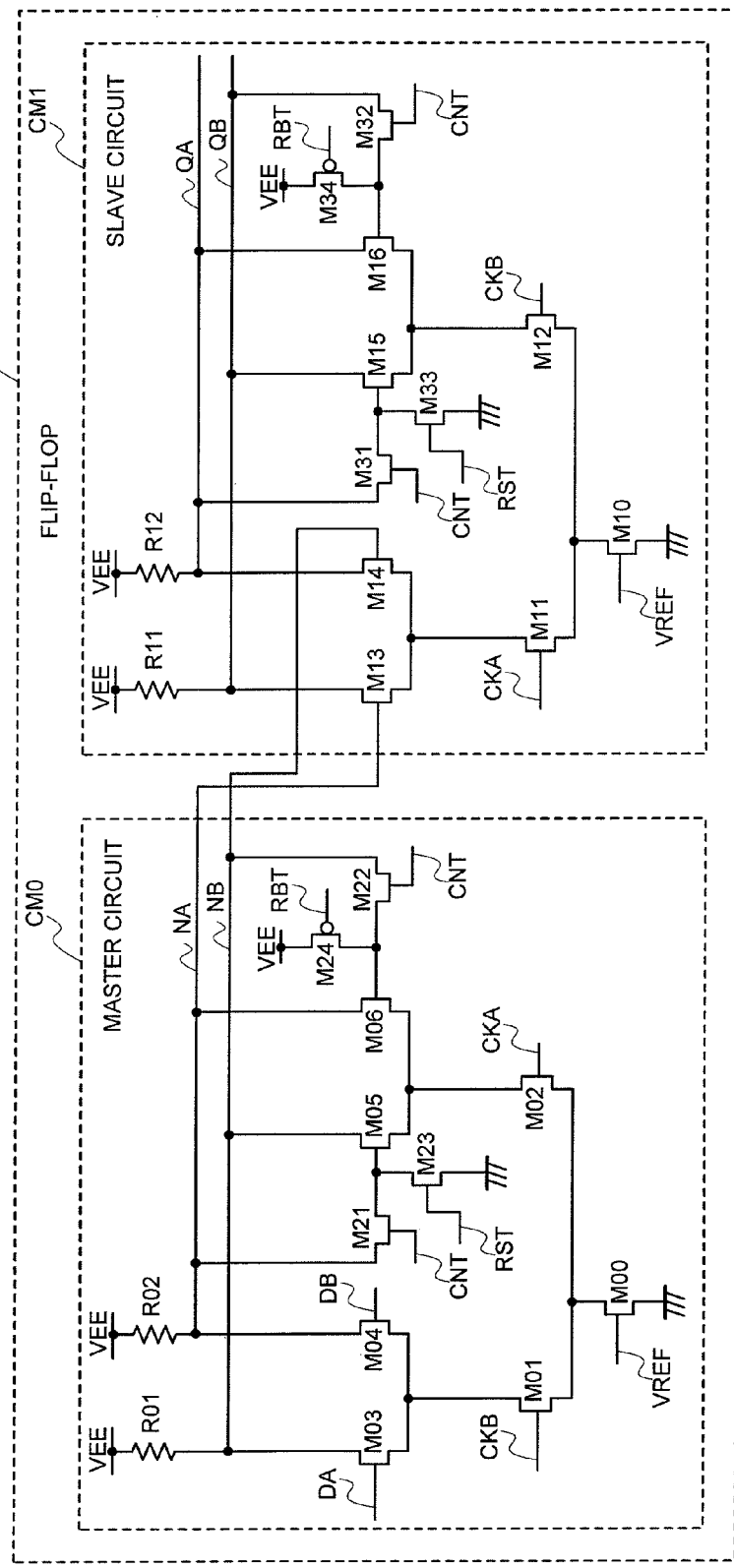
FIG. 1 is a circuit diagram illustrating a configuration of a flip-flop in a first exemplary embodiment of the present invention.

Next, a differential flip-flop FF1 of a first exemplary embodiment of the present invention will be explained in details by making a reference to the accompanied drawings. FIG. 1 is a circuit diagram illustrating a configuration of the flip-flop FF1 of the first exemplary embodiment of the present invention.

Upon making a reference to FIG. 1, the flip-flop FF1 of the present invention includes a master circuit CM0 and a slave circuit CM1. The master circuit CM0 and the slave circuit CM1 are of an identical type.

The master circuit CM0 includes a resistance element R01, a resistance element R02, a current controlling transistor M00, a clocking transistor M01, a clocking transistor M02, an inputting transistor M03, an inputting transistor M04, a data holding transistor M05, a data holding transistor M06, a switching transistor M21, a switching transistor M22, a resetting transistor M23, and a resetting transistor M24.

The slave circuit CM1 includes a resistance element R11, a resistance element R12, a current controlling transistor M10, a clocking transistor M11, a clocking transistor M12, an inputting transistor M13, an inputting transistor M14, a data holding transistor M15, a data holding transistor M16, a switching transistor M31, a switching transistor M32, a resetting transistor M33, and a resetting transistor M34.

The resistance elements R01, R02, R11, and R12 are connected to a power source VEE. Further, the current controlling transistors M00 and M10 are connected to a current controlling signal VREF. Herein, for example, in a case of configuring the flip-flop FF1 with a CML (Current Mode Logic), the voltage of the power source VEE could be 1.5 Volt or so, and the voltage of the current controlling signal VREF could be 0.7 Volt or so. However, the voltage is not limited to the above-mentioned value.

The inputting transistor M03 is connected to an input signal DA, and the inputting transistor M04 is connected to an inverted input signal DB, being an inverted version of the input signal DA. The inputting transistor M13 is connected to an internal node NA, and the inputting transistor M14 is connected to an internal node NB, being an inverted version of the internal node NA.

The clocking transistors M02 and M11 are connected to a clock signal CKA. The clocking transistors M01 and M12 are connected to an inverted clock signal CKB, being an inverted version of the clock signal CKA.

In the master circuit CM0, the switching transistor M21 being controlled by a switch signal CNT is connected between a gate electrode of the data holding transistor M05 and the internal node NA. Further, the resetting transistor M23 being controlled by a reset signal RST is connected between the gate electrode of the data holding transistor M05 and a ground.

Further, the switching transistor M22 being controlled by the switch signal CNT is connected between the gate electrode of the data holding transistor M06 and the internal node NB. Further, the resetting transistor M24 being controlled by an inverted reset signal RBT, being an inverted version of the reset signal RST, is connected between the gate electrode of the data holding transistor M06 and the power source VEE.

In the slave circuit CM1, the switching transistor M31 being controlled by the switch signal CNT is connected between the gate electrode of the data holding transistor M15 and an output signal QA. Further, the resetting transistor M33 being controlled by the reset signal RST is connected between the gate electrode of the data holding transistor M15 and the ground.

Further, the switching transistor M32 being controlled by the switch signal CNT is connected between the gate electrode of the data holding transistor M16 and an inverted output signal QB. Further, the resetting transistor M34 being controlled by the inverted reset signal RBT is connected between the gate electrode of the data holding transistor M16 and the power source VEE.

Further, an identical signal is all connected inside the flip-flop FF1. For example, the switch signal CNT is all connected. Further, the switch signal CNT and the inverted reset signal RBT are connected to each other inside or outside the flip-flop FF1. That is, a configuration in which the switch signal CNT is the inverted reset signal RBT is enabled.

Figure 2:
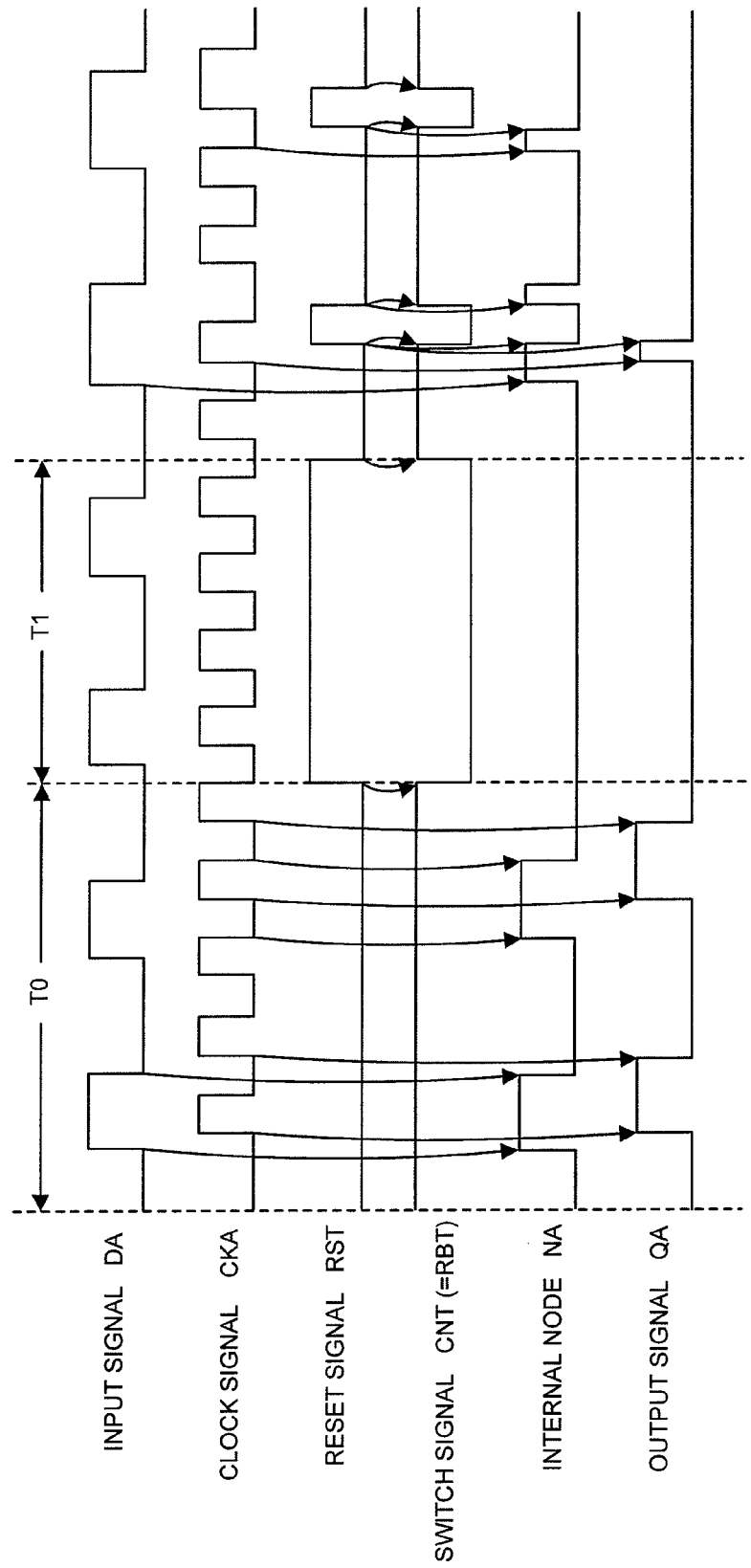
FIG. 2 is a time chart illustrating an operation in the first exemplary embodiment of the present invention.

Next, an operation of the first exemplary embodiment of the present invention will be explained by making a reference to the accompanied drawings. FIG. 2 is a time chart illustrating an operation of the first exemplary embodiment of the present invention.

Upon making a reference to FIG. 2, in a time period T0, the level of the switch signal CNT is "1", the switching transistors M21, M22, M31, and M32 are switched on, and the data holding transistors M05, M06, M15, and M16 perform a holding operation, respectively. Thus, in the time period T0, the flip-flop FF1 performs a normal operation. At this time, there is a necessity for previously switching off the resetting transistors M23, M24, M33, and M34 by setting the reset signal RST and the inverted reset signal RBT to "0" and "1", respectively.

In a time period T1, the reset operation is executed. The level of the switch signal CNT becomes "0", so the switching transistors M21, M22, M31, and M32 are switched off. Further, the levels of the reset signal RST and the inverted reset signal RBT become "1" and "0", respectively, the resetting transistors M23, M24, M33, and M34 are switched on, and the levels of the gate electrodes of the data holding transistor M05 and M15 become "0", and the levels of the gate electrodes of the data holding transistor M06 and M16 become "1". Thus, in the time period T1, the levels of the internal node NA and the output signal QA become "0", and the levels of the internal node NB and the inverted output signal QB become "1".

Herein, if the switching transistors M21, M22, M31, and M32, and the resetting transistors M23, M24, M33, and M34 are simultaneously switched on, or are simultaneously switched off, the levels of the internal node NA, the internal node NB, the output signal QA, and the inverted output signal QB become an indefinite value, whereby a control has to be taken any time so that each of the switch signal CNT and the inverted reset signal RBT has an identical electric potential.

In FIG. 1, the resetting transistors M23 and M33, and the resetting transistors M24 and M34 differ from each other in a type. For example, the resetting transistors M23 and M33 are of an n-type transistor, and the resetting transistors M24 and M34 are of a p-type transistor.

However, it is also possible to make a configuration so that each of the resetting transistors M23, M33, M24, and M34 is of an identical type (for example, an n-type transistor). In this case, the resetting transistors M24 and M34 are controlled not by the inverted reset signal RBT but by the reset signal RST.

As explained above, in the flip-flop FF1 of the first exemplary embodiment of the present invention, the resetting transistors M23, M33, M24, and M34 are not stacked vertically upon the data holding transistors M05, M06, M15, and M16 for connection. Thus, the flip-flop FF1 has an effect that the voltages at the time that the levels of the internal node NA, the internal node NB, the output signal QA, and the inverted output signal QB are logic "0" do not rise, and the operation does not become unstable.

Figure 3:
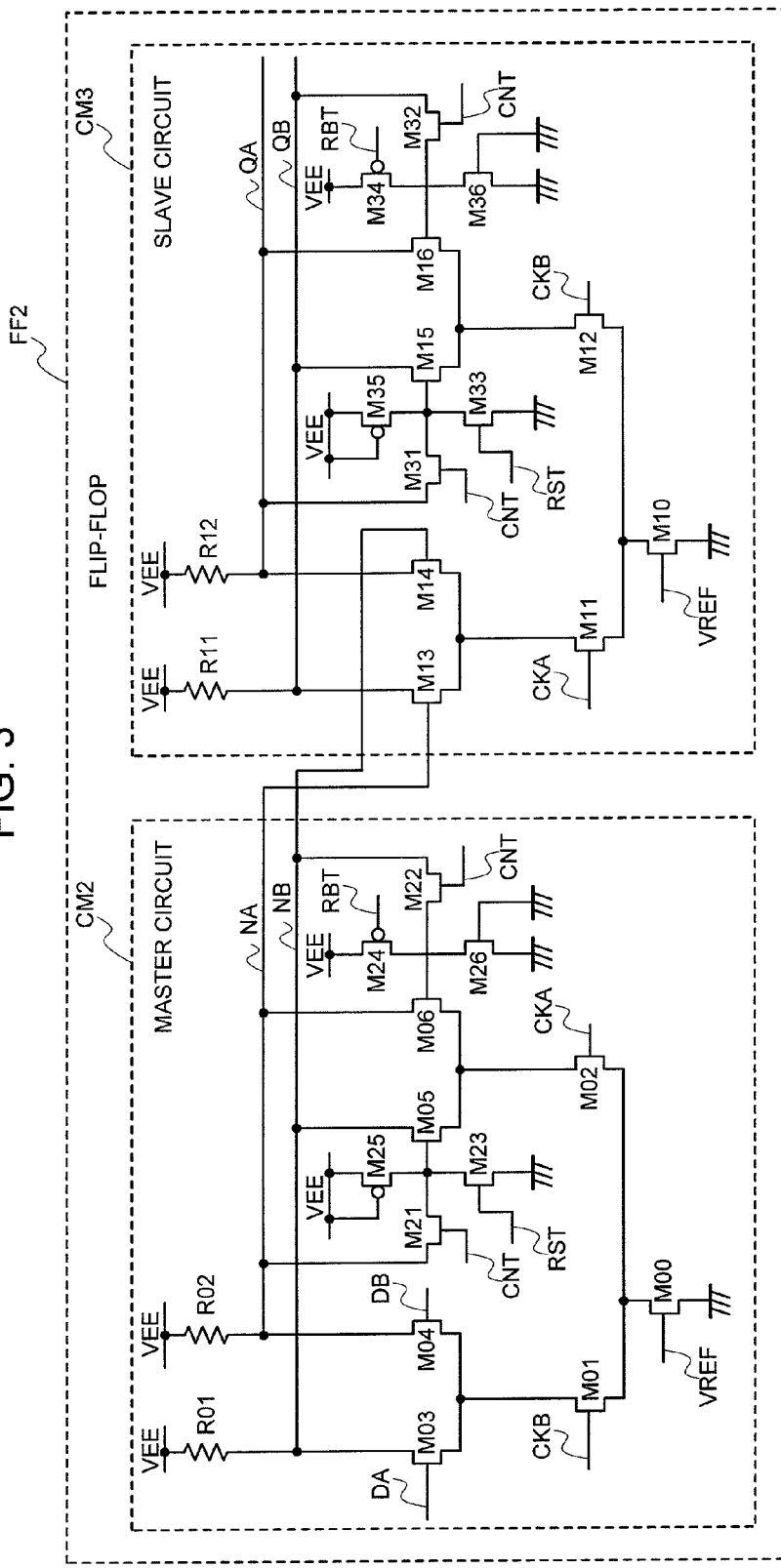
FIG. 3 is a circuit diagram illustrating a configuration of a flip-flop in a second exemplary embodiment of the present invention.

Next, a differential flip-flop FF2 of the second exemplary embodiment of the present invention will be explained by making a reference to the accompanied drawings. FIG. 3 is a circuit diagram illustrating a configuration of the differential flip-flop FF2 of the second exemplary embodiment of the present invention.

Upon making a reference to FIG. 3, the differential flip-flop FF2 of the second exemplary embodiment of the present invention assumes a configuration in which a dummy transistor M25 for equalizing a load capacity, a dummy transistor M26, a dummy transistor M35, and a dummy transistor M36 have been added to the configuration of the flip-flop FF1 of the first exemplary embodiment. A master circuit CM2 includes dummy transistors M25 and M26, and a slave circuit CM3 includes dummy transistors M35 and M36.

However, the resetting transistor M23 and the resetting transistors M24 differs from each other in a type. For example, each of the resetting transistors M23 and M33 is an n-type transistor, and each of the resetting transistors M24 and M34 is a p-type transistor. Herein, the dummy transistor M25 is identical to the resetting transistors M24 in a type (p-type transistor). The dummy transistor M26 is identical to the resetting transistors M23 in a type (n-type transistor). The dummy transistor M35 is identical to the resetting transistors M34 in a type (p-type transistor). The dummy transistor M36 is identical to the resetting transistors M33 in a type (n-type transistor).

The dummy transistor M25 (the gate electrode thereof is connected to the power source VEE) is connected between the gate electrode of the data holding transistor M05 and the power source VEE. Further, the dummy transistor M26 (the gate electrode thereof is connected to the ground) is connected between the gate electrode of the data holding transistor M06 and the ground. Further, the dummy transistor M35 (the gate electrode thereof is connected to the power source VEE) is connected between the gate electrode of the data holding transistor M15 and the power source VEE. Further, the dummy transistor M36 (the gate electrode thereof is connected to the ground) is connected between the gate electrode of the data holding transistor M15 and the power source VEE.

Thus, the dummy transistors M25, M26, M35, and M36 operate merely as a load because they are off at any time. Further, the n-type transistor, or the p-type transistor is connected to all of the data holding transistors M05, M06, M15, and M16, and resultantly, the loads of them are equalized with each other.

The second exemplary embodiment of the present invention, as mentioned above, has an effect that by equalizing the load upon each of the data holding transistors M05, M06, M15, and M16 with the load upon the other, the circuit loads for the internal node NA, the internal node NB, the output signal QA, and the inverted output signal QB each of which is a differential signal become equivalent to each other at the time of the normal operation, thereby enabling a characteristic dispersion between the differential signals to be alleviated.

Figure 4:
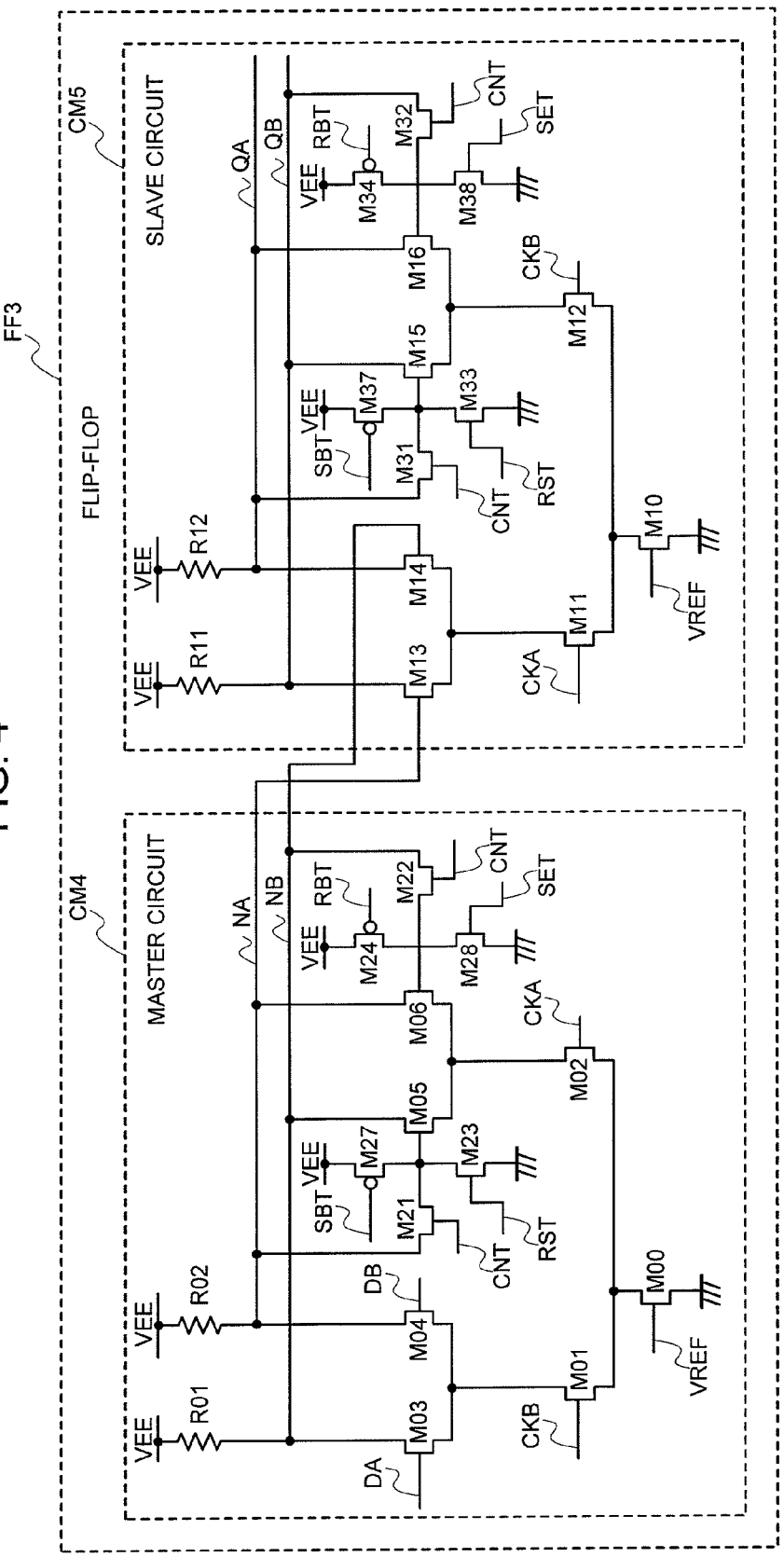
FIG. 4 is a circuit diagram illustrating a configuration of a flip-flop in a third exemplary embodiment of the present invention.

Next, a differential flip-flop FF3 of the third exemplary embodiment of the present invention will be explained by making a reference to the accompanied drawings. FIG. 4 is a circuit diagram illustrating a configuration of the differential flip-flop FF3 of the third exemplary embodiment of the present invention.

Upon making a reference to FIG. 4, the differential flip-flop FF3 of the third exemplary embodiment of the present invention has a setting function as compared with the differential flip-flop FF1 of the first exemplary embodiment of the present invention. The differential flip-flop FF3 assumes a configuration in which a setting transistor M27, a setting transistor M28, a setting transistor M37, and a setting transistor M38 have been added to the configuration of the flip-flop FF1 of the first exemplary embodiment of the present invention.

A master circuit CM4 includes the setting transistors M27 and M28, and a slave circuit CM5 includes the setting transistors M37 and M38.

The setting transistor M27 being controlled by an inverted set signal SBT, being an inverted version of a set signal SET, is connected between the gate electrode of the data holding transistor M05 and the power source VEE. Further, the setting transistor M28 being controlled by the set signal SET is connected between the gate electrode of the data holding transistor M06 and the ground. The setting transistor M37 being controlled by the inverted set signal SBT is connected between the gate electrode of the data holding transistor M15 and the power source VEE. Further, the setting transistor M38 being controlled by the set signal SET is connected between the gate electrode of the data holding transistor M16 and the ground.

Figure 5:
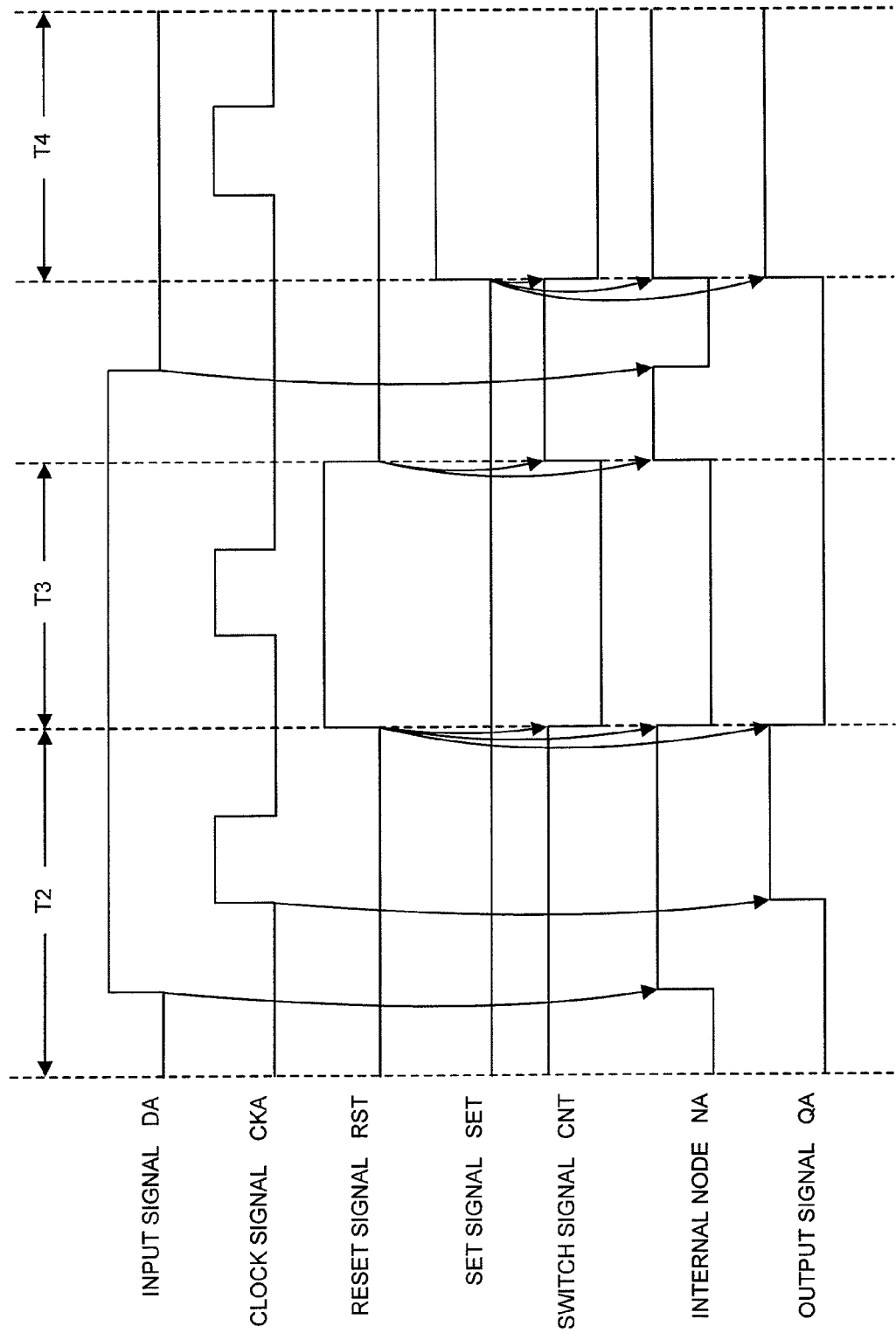
FIG. 5 is an explanatory view illustrating an operational in the third exemplary embodiment of the present invention.

Next, an operation of the third exemplary embodiment of the present invention will be explained by making a reference to the accompanied drawings. FIG. 5 is an explanatory view illustrating an operation of the third exemplary embodiment of the present invention.

Upon making a reference to FIG. 5, in a time period T2, the level of the switch signal CNT is "1", the switching transistors M21, M22, M31, and M32 are switched on, and the data holding transistors M05, M06, M15, and M16 perform a holding operation, respectively. Thus, in the time period T2, the flip-flop FF3 performs a normal operation. At this time, there is a necessity for previously switching off the resetting transistors M23, M24, M33, and M34 by setting the reset signal RST and the inverted reset signal RBT to "0" and "1", respectively. Further, there is a necessity for previously switching off the setting transistors M27, M28, M37, and M38 by setting the set signal SET and the inverted set signal SBT to "0" and "1", respectively.

In a time period T3, the reset operation is executed. The level of the switch signal CNT becomes "0", so the switching transistors M21, M22, M31, and M32 are switched off. Further, the levels of the reset signal RST and the inverted reset signal RBT become "1" and "0", respectively, the resetting transistors M23, M24, M33, and M34 are switched on, the level of the gate electrode of the data holding transistor M05 and M15 become "0", and the levels of the gate electrodes of the data holding transistor M06 and M16 become "1". Thus, in the time period T3, the levels of internal node NA and the output signal QA become "0", and the levels of the internal node NB and the inverted output signal QB become "1".

In a time period T4, the set operation is executed. The level of the switch signal CNT becomes "0", so the switching transistors M21, M22, M31, and M32 are switched off. Further, the levels of the reset signal RST and the inverted reset signal RBT become "0" and "1", respectively, and the resetting transistors M23, M24, M33, and M34 are switched on. Further, the levels of the set signal SET and the inverted set signal SBT become "1" and "0", respectively, and the setting transistors M27, M28, M37, and M38 are switched on, the levels of the gate electrode of the data holding transistors M05 and M15 become "1" and the levels of the gate electrodes of the data holding transistors M06 and M16 become "0".

Herein, if the resetting transistors M23, M24, M33, and M34, or the setting transistors M27, M28, M37, and M38 are simultaneously switched on at the time that the switching transistors M21, M22, M31, and M32 are on, and if the resetting transistors M23, M24, M33, and M34, and the setting transistors M27, M28, M37, and M38 are simultaneously switched on at the time that the switching transistors M21, M22, M31, and M32 are off, the levels of the internal node NA, the internal node NB, the output signal QA, and the inverted output signal QB could become an indefinite value.

For this, a control has to be taken so that the level of the reset signal RST and the set signal SET do not become "1" simultaneously. In a case where the levels of both of the reset signal RST and the set signal SET are "0", a control has to be taken so that the switch signal CNT is set to "1".

As explained above, in the flip-flop FF3 of the third exemplary embodiment of the present invention, the setting transistors M27, M28, M37, and M38 are not stacked vertically upon the data holding transistors M05, M06, M15, and M16 for connection. Thus, the flip-flop FF3 has an effect that the voltages at the time that the levels of the internal node NA, the internal node NB, the output signal QA, and the inverted output signal QB are logic "0" do not rise, and the operation does not become unstable.

Figure 6:
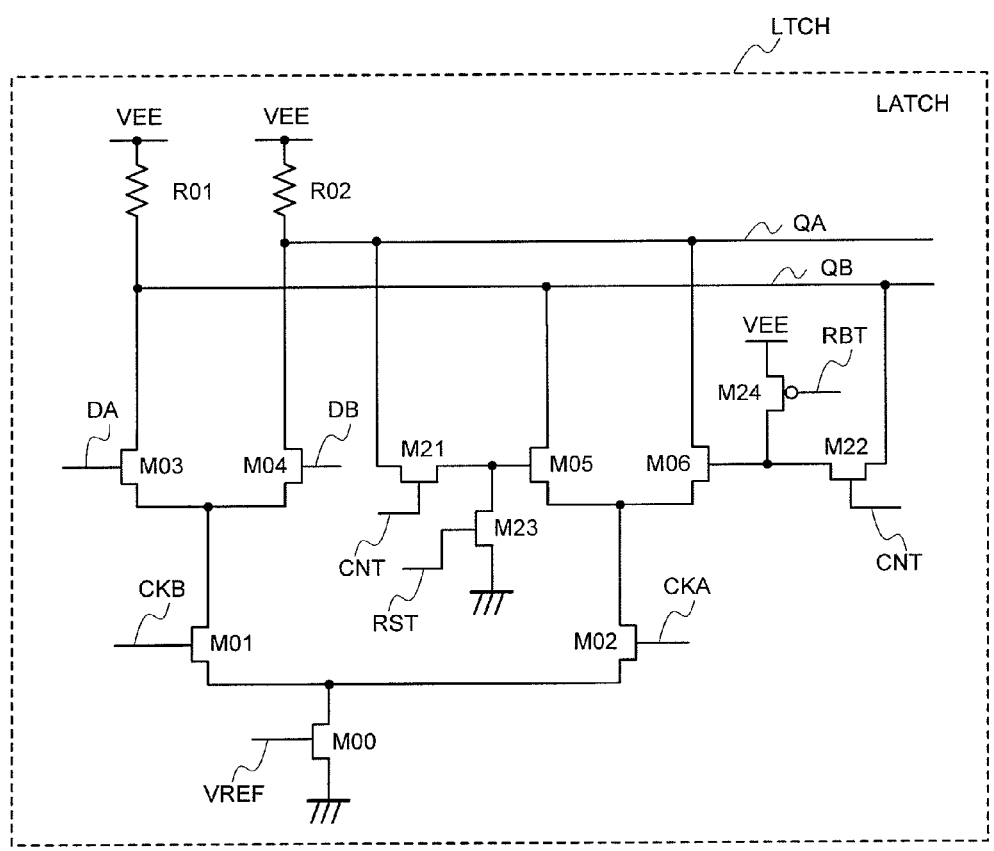
FIG. 6 is a block diagram illustrating a configuration of a latch in a fourth exemplary embodiment of the present invention.

Next, the fourth exemplary embodiment of the present invention will be explained. The fourth exemplary embodiment of the present invention is a latch LTCH that is configured of one of the master circuit CM0 of the first exemplary embodiment, CM2 of the second exemplary embodiment, and CM4 of the third exemplary embodiment. FIG. 6 is a block diagram illustrating a configuration of the latch LTCH of the fourth exemplary embodiment of the present invention.

Upon making a reference to FIG. 6, the latch LTCH is configured of the master circuit CM0. The internal node NA becomes the output signal QA, and the internal node NB becomes the inverted output signal QB. An operation of the latch LTCH of the fourth exemplary embodiment is identical to that of the master circuit CM0 of the first exemplary embodiment of the present invention, that of the master circuit CM2 of the second exemplary embodiment, or that of the master circuit CM4 of the third exemplary embodiment.

The fourth exemplary embodiment of the present invention, which is configured of not the flip-flop but the latch, has an effect that it can be universally utilized.

Figure 7:
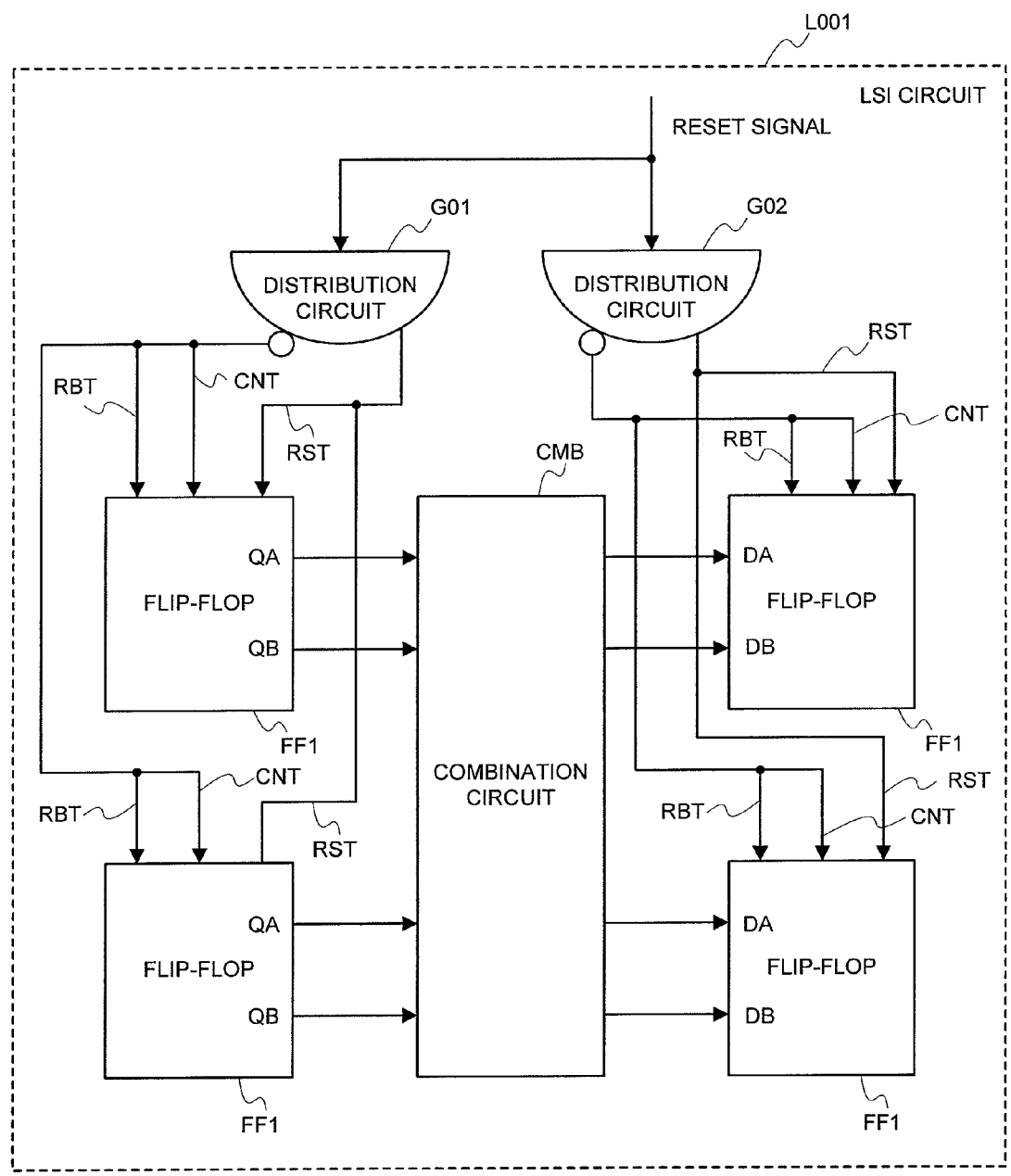
FIG. 7 is a block diagram illustrating a configuration of an LSI circuit in a fifth exemplary embodiment of the present invention.

Next, the fifth exemplary embodiment of the present invention will be explained. The fifth exemplary embodiment of the present invention is an LSI circuit L001 (Large Scale Integration) that includes the flip-flop FF1 of the first exemplary embodiment of the present invention, the flip-flop FF2 of the second exemplary embodiment, the flip-flop FF3 of the third exemplary embodiment, or the latch LTCH of the fourth exemplary embodiment. FIG. 7 is a block diagram illustrating a configuration of the LSI circuit L001 of the fifth exemplary embodiment of the present invention. In particular, FIG. 7 includes the flip-flop FF1 of the first exemplary embodiment; however the fifth exemplary embodiment is not limited hereto.

Upon making a reference to FIG. 7, the LSI circuit L001 includes a distribution circuit G01, a distribution circuit G02, a combination circuit CMB, and four flip-flops FF1. The reset signal RST, the inverted reset signal RBT, and the switch signal CNT are distributed to the flip-flops FF1 from the distribution circuit G01 and the distribution circuit G02. The inverted reset signal RBT and the switch signal CNT are a signal having an identical logic, respectively. The LSI circuit L001 can include a circuit for distributing the set signal SET and the inverted set signal SBT, which is not shown in the figure.

The LSI circuit L001 of the fifth exemplary embodiment of the present invention has an effect that reliability is enhanced even though it has the resetting function because the flip-flop FF1, the flip-flop FF2, the flip-flop FF3, or the latch LTCH, of which the operation does not become unstable, is used.

As mentioned above, the 1st invention for solving the above-mentioned problems is characterized in that a differential latch comprising a data holding transistor, said differential latch comprising: a resetting transistor that is connected to a gate electrode of said data holding transistor and is controlled by a reset signal; and a switching transistor that is connected to the gate electrode of said data holding transistor and is controlled by a switch signal, being an inverted version of the reset signal.

In the above-mentioned invention, the 2nd invention for solving the above-mentioned problems is characterized in that two of said differential latches are connected.

In the above-mentioned invention, the 3rd invention for solving the above-mentioned problems is characterized in that said differential latch comprising an equalizing transistor for equalizing a load capacity that is connected to the gate electrode of said data holding transistor.

In the above-mentioned 3rd invention, the 4th invention for solving the above-mentioned problems is characterized in that two of said differential latches are connected.

In the above-mentioned invention, the 5th invention for solving the above-mentioned problems is characterized in that said differential latch comprising a setting transistor that is connected to the gate electrode of said data holding transistor and is controlled by a set signal.

In the above-mentioned 5th invention, the 6th invention for solving the above-mentioned problems is characterized in that two of said differential latches are connected.

The 7th invention for solving the above-mentioned problems is characterized in that an LSI, comprising: one or more of said differential latches according to the 1st invention; a combination circuit; a reset signal distribution circuit; and a switch signal distribution circuit.

The 8th invention for solving the above-mentioned problems is characterized in that an LSI, comprising: one or more of said differential latches according to the 3rd invention; a combination circuit; a reset signal distribution circuit; and a switch signal distribution circuit.

The 9th invention for solving the above-mentioned problems is characterized in that an LSI, comprising: one or more of said differential flip-flops according to the 4th invention; a combination circuit; a reset signal distribution circuit; and a switch signal distribution circuit.

The 10th invention for solving the above-mentioned problems is characterized in that an LSI, comprising: one or more of said differential latches according to the 5th invention; a combination circuit; a reset signal distribution circuit; a switch signal distribution circuit; and a set signal distribution circuit.

The 11th invention for solving the above-mentioned problems is characterized in that an LSI, comprising: one or more of said differential flip-flops according to the 6th invention; a combination circuit; a reset signal distribution circuit; a switch signal distribution circuit; and a set signal distribution circuit.

The 12th invention for solving the above-mentioned problems is characterized in that a differential latch comprising a first data holding transistor and a second data holding transistor, said differential latch comprising: a first resetting transistor that is connected to a gate electrode of said first data holding transistor and is controlled by a reset signal; a first switching transistor that is connected to the gate electrode of said first data holding transistor and is controlled by a switch signal, being an inverted version of said reset signal; a second resetting transistor that is connected to the gate electrode of said second data holding transistor is controlled by the reset signal; and a second switching transistor that is connected to the gate electrode of said second data holding transistor and is controlled by said switch signal.

In the above-mentioned 12th invention, the 13th invention for solving the above-mentioned problems is characterized in that two of said differential latches are connected.

In the above-mentioned 12th invention, the 14th invention for solving the above-mentioned problems is characterized in that said differential latch comprising: a first equalizing transistor for equalizing a load capacity that has a load capacity identical to that of said second resetting transistor and is connected to the gate electrode of said first data holding transistor; and a second equalizing transistor for equalizing a load capacity that has a load capacity identical to that of said first resetting transistor and is connected to the gate electrode of said second data holding transistor.

In the above-mentioned 14th invention, the 15th invention for solving the above-mentioned problems is characterized in that two of said differential latches are connected.

In the above-mentioned 12th invention, the 16th invention for solving the above-mentioned problems is characterized in that said differential latch comprising: a first setting transistor that is connected to the gate electrode of said first data holding transistor and is controlled by an inverted set signal, being an inverted version of a set signal; and a second setting transistor that is connected to the gate electrode of said second data holding transistor and is controlled by said set signal.

In the above-mentioned 16th invention, the 17th invention for solving the above-mentioned problems is characterized in that two of said differential latches are connected.

The 18th invention for solving the above-mentioned problems is characterized in that an LSI, comprising: one or more of said differential latches according to the 12th invention; a combination circuit; a reset signal distribution circuit; and a switch signal distribution circuit.

The 19th invention for solving the above-mentioned problems is characterized in that an LSI, comprising: one or more of said differential latches according to the 14th invention; a combination circuit; a reset signal distribution circuit; and a switch signal distribution circuit.

The 20th invention for solving the above-mentioned problems is characterized in that an LSI, comprising: one or more of said differential flip-flops according to the 15th invention; a combination circuit; a reset signal distribution circuit; and a switch signal distribution circuit.

The 21st invention for solving the above-mentioned problems is characterized in that an LSI, comprising: one or more of said differential latches according to the 16th invention; a combination circuit; a reset signal distribution circuit; a switch signal distribution circuit; a set signal distribution circuit; and an inverted set signal distribution circuit.

The 22nd invention for solving the above-mentioned problems is characterized in that an LSI, comprising: one or more of said differential flip-flops according to the 17th invention; a combination circuit; a reset signal distribution circuit; a switch signal distribution circuit; a set signal distribution circuit; and an inverted set signal distribution circuit.

The 23rd invention for solving the above-mentioned problems is characterized in that a differential latch comprising a first inputting transistor, a second inputting transistor, a first data holding transistor, and a second data holding transistor, said differential latch comprising: a first switching transistor that is connected to a gate electrode of said first data holding transistor and said second inputting transistor, and is controlled by a switch signal, being an inverted version of a reset signal; a first resetting transistor that is connected to the gate electrode of said first data holding transistor and a ground, and is controlled by said reset signal; a second switching transistor that is connected to the gate electrode of said second data holding transistor and said first inputting transistor, and is controlled by said switch signal; and a second resetting transistor that is connected to the gate electrode of said second data holding transistor and a power source, and is controlled by an inverted reset signal, being an inverted version of said reset signal.

In the above-mentioned 23rd invention, the 24th invention for solving the above-mentioned problems is characterized in that two of said differential latches are connected.

In the above-mentioned 25th invention, the 23rd invention for solving the above-mentioned problems is characterized in that said differential latch comprising: a first equalizing transistor for equalizing a load capacity that has a load capacity identical to that of said second resetting transistor and is connected to the gate electrode of said first data holding transistor and the power source; and a second equalizing transistor for equalizing a load capacity that has a load capacity identical to that of said first resetting transistor and is connected to the gate electrode of said second data holding transistor and the ground.

In the above-mentioned 25th invention, the 26th invention for solving the above-mentioned problems is characterized in that two of said differential latches are connected.

In the above-mentioned 23rd invention, the 27th invention for solving the above-mentioned problems is characterized in that said differential latch comprising: a first setting transistor that has is connected to the gate electrode of said first data holding transistor and the power source, and is controlled by an inverted set signal, being an inverted version of a set signal; and a second setting transistor that is connected to the gate electrode of said second data holding transistor and the ground, and is controlled by said set signal.

In the above-mentioned 27th invention, the 28th invention for solving the above-mentioned problems is characterized in that two of said differential latches are connected.

The 29th invention for solving the above-mentioned problems is characterized in that an LSI, comprising: one or more of said differential latches according to the 23rd invention; a combination circuit; a reset signal distribution circuit; and a switch signal distribution circuit.

The 30th invention for solving the above-mentioned problems is characterized in that an LSI, comprising: one or more of said differential latches according to the 25th invention; a combination circuit; a reset signal distribution circuit; and a switch signal distribution circuit.

The 31st invention for solving the above-mentioned problems is characterized in that an LSI, comprising: one or more of said differential flip-flops according to the 26th invention; a combination circuit; a reset signal distribution circuit; and a switch signal distribution circuit.

The 32nd invention for solving the above-mentioned problems is characterized in that an LSI, comprising: one or more of said differential latches according to the 27th invention; a combination circuit; a reset signal distribution circuit; a switch signal distribution circuit; a set signal distribution circuit; and an inverted set signal distribution circuit.

The 33rd invention for solving the above-mentioned problems is characterized in that an LSI, comprising: one or more of said differential flip-flops according to the 28th invention; a combination circuit; a reset signal distribution circuit; a switch signal distribution circuit; a set signal distribution circuit; and an inverted set signal distribution circuit.

The 34th invention for solving the above-mentioned problems is characterized in that a differential latch configuration method in a differential latch comprising a data holding transistor, wherein a resetting transistor that is connected to a gate electrode of said data holding transistor and is controlled by a reset signal, and a switching transistor that is connected to the gate electrode of said data holding transistor and is controlled by a switch signal, being an inverted version of the reset signal, are connected.

In the above-mentioned invention, the 35th invention for solving the above-mentioned problems is characterized in that an equalizing transistor for equalizing a load capacity is connected to the gate electrode of said data holding transistor.

In the above-mentioned inventions, the 36th invention for solving the above-mentioned problems is characterized in that a setting transistor being controlled by a set signal is connected to the gate electrode of said data holding transistor.

In the above-mentioned 34th invention, the 37th invention for solving the above-mentioned problems is characterized in that two of said differential latches are connected.

In the above-mentioned 35th invention, the 38th invention for solving the above-mentioned problems is characterized in that two of said differential latches are connected.

In the above-mentioned 36th invention, the 39th invention for solving the above-mentioned problems is characterized in that two of said differential latches are connected.

The 40th invention for solving the above-mentioned problems is characterized in that a differential latch configuration method in a differential latch comprising a first data holding transistor and a second data holding transistor: wherein a first resetting transistor that is connected to a gate electrode of said first data holding transistor and is controlled by a reset signal, and a first switching transistor that is connected to the gate electrode of said first data holding transistor and is controlled by a switch signal, being an inverted version of said reset signal are connected; and wherein a second resetting transistor that is connected to the gate electrode of said second data holding transistor and is controlled by the reset signal, and a second switching transistor that is connected to the gate electrode of said second data holding transistor and is controlled by said switch signal are connected.

The 41st invention for solving the above-mentioned problems is characterized in that a differential latch configuration method in a differential latch comprising a first inputting transistor, a second inputting transistor, a first data holding transistor, and a second data holding transistor: wherein a first switching transistor that is connected to a gate electrode of said first data holding transistor and said second inputting transistor, and is controlled by a switch signal, being an inverted version of a reset signal, and a first resetting transistor that is connected to the gate electrode of said first data holding transistor and a ground, and is controlled by said reset signal are connected; and wherein a second switching transistor that is connected to the gate electrode of said second data holding transistor and said first inputting transistor, and is controlled by said switch signal, and a second resetting transistor that is connected to the gate electrode of said second data holding transistor and a power resource, and is controlled by an inverted reset signal, being an inverted version of said reset signal, are connected.

While the invention has been particularly shown and described with reference to exemplary embodiments thereof, the invention is not limited to these exemplary embodiments. It will be understood by those of ordinary skill in the art that various changes in form and details may be made therein without departing from the spirit and scope of the present invention as defined by the claims.

What is claimed is:

1. A differential latch comprising a first data holding transistor and a second data holding transistor, said differential latch comprising:
   a first resetting transistor that is connected to a gate electrode of said first data holding transistor and is controlled by a reset signal;
   a first switching transistor that is connected to the gate electrode of said first data holding transistor and is controlled by a switch signal, being an inverted version of said reset signal;
   a second resetting transistor that is connected to the gate electrode of said second data holding transistor is controlled by the reset signal;
   a second switching transistor that is connected to the gate electrode of said second data holding transistor and is controlled by said switch signal;
   a first equalizing transistor for equalizing a load capacity that has a load capacity identical to that of said second resetting transistor and is connected to the gate electrode of said first data holding transistor; and
   a second equalizing transistor for equalizing a load capacity that has a load capacity identical to that of said first resetting transistor and is connected to the gate electrode of said second data holding transistor.

2. A differential flip-flop, wherein two of said differential latches according to claim 1 are connected.

3. An LSI, comprising:
   one or more of said differential latches according to claim 1;
   a combination circuit;
   a reset signal distribution circuit; and
   a switch signal distribution circuit.

4. An LSI, comprising:
   one or more of said differential flip-flops according to claim 2;
   a combination circuit;
   a reset signal distribution circuit; and
   a switch signal distribution circuit.

5. A differential latch comprising a first inputting transistor, a second inputting transistor, a first data holding transistor, and a second data holding transistor, said differential latch comprising:
   a first switching transistor that is connected to a gate electrode of said first data holding transistor and said second inputting transistor, and is controlled by a switch signal, being an inverted version of a reset signal;
   a first resetting transistor that is connected to the gate electrode of said first data holding transistor and a ground, and is controlled by said reset signal;
   a second switching transistor that is connected to the gate electrode of said second data holding transistor and said first inputting transistor, and is controlled by said switch signal;
   a second resetting transistor that is connected to the gate electrode of said second data holding transistor and a power source, and is controlled by an inverted reset signal, being an inverted version of said reset signal;
   a first equalizing transistor for equalizing a load capacity that has a load capacity identical to that of said second resetting transistor and is connected to the gate electrode of said first data holding transistor and the power source; and
   a second equalizing transistor for equalizing a load capacity that has a load capacity identical to that of said first resetting transistor and is connected to the gate electrode of said second data holding transistor and the ground.

6. A differential flip-flop, wherein two of said differential latches according to claim 5 are connected.

7. An LSI, comprising:
   one or more of said differential latches according to claim 5;
   a combination circuit;
   a reset signal distribution circuit; and
   a switch signal distribution circuit.

8. An LSI, comprising:
   one or more of said differential flip-flops according to claim 6;
   a combination circuit;
   a reset signal distribution circuit; and
   a switch signal distribution circuit.

* * * * *